(12) United States Patent
Nagaraj

(10) Patent No.: US 6,259,316 B1
(45) Date of Patent: Jul. 10, 2001

(54) LOW VOLTAGE BUFFER AMPLIFIER FOR HIGH SPEED SAMPLE AND HOLD APPLICATIONS

(75) Inventor: Krishnaswamy Nagaraj, Somerville, NJ (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/310,619

(22) Filed: May 12, 1999

Related U.S. Application Data

(60) Provisional application No. 60/087,199, filed on May 29, 1998.

(51) Int. Cl.$^7$ ........................................... H03F 1/02
(52) U.S. Cl. ................................. 330/9; 330/253
(58) Field of Search ................... 330/9, 253, 292

(56) References Cited

U.S. PATENT DOCUMENTS

| | | | | |
|---|---|---|---|---|
| 4,335,355 | * | 6/1982 | Haque | 330/252 |
| 4,524,329 | * | 6/1985 | Abou | 330/253 |
| 4,800,339 | * | 1/1989 | Tanimoto et al. | 330/253 |
| 4,912,425 | * | 3/1990 | Kobayashi et al. | 330/253 |
| 5,394,111 | * | 2/1995 | Tsuji et al. | 330/9 |
| 6,049,253 | * | 4/2000 | Takayama | 330/253 |
| 6,084,476 | * | 7/2000 | Hamanishi et al. | 330/253 |

FOREIGN PATENT DOCUMENTS

| | | |
|---|---|---|
| 0 448 169 | 9/1991 | (EP) . |
| 0 598 308 | 5/1994 | (EP) . |

\* cited by examiner

*Primary Examiner*—Robert Pascal
*Assistant Examiner*—Khanh Van Nguyen
(74) *Attorney, Agent, or Firm*—Wade James Brady, III; Frederick J. Telecky, Jr.

(57) ABSTRACT

An addition is made to the prior art amplifier of additional transistor (M9) controlled by the input voltage, Vin, in series with the second stage (M5, M6) and a capacitor level shifter (C1) between the output of the first stage (junction of M2 and M3) of the amplifier and the gate terminal of the source follower transistor M7. This capacitor C1 is charged such that the signal between the first stage and the source follower stage sees an upward dc voltage shift, thus maintaining the quiescent gate voltage for the source follower transistor M7 close to or even higher than the supply voltage while maintaining the quiescent voltage at the output of the first stage (junction of M1 and M2) sufficiently low for transistors M2 and M3 to operate in saturation regions.

10 Claims, 2 Drawing Sheets

LOW VOLTAGE BUFFER AMPLIFIER FOR HIGH SPEED SAMPLE AND HOLD APPLICATIONS

CROSS REFERENCE TO PRIOR APPLICATIONS

This applications claims priority under 35 U.S.C. 119(e) based upon provisional application Ser. No. 60/087,199, filed May 29, 1998 entitled Low Voltage Buffer Amplifier For High Speed S/H Applications, the contents of which are incorporated herein by reference.

FIELD OF THE INVENTION

This invention relates to a low voltage buffer amplifier, primarily for use in conjunction with high speed sample and hold (S/H) circuits.

BACKGROUND AND BRIEF DESCRIPTION OF THE PRIOR ART

A sample and hold circuit is usually employed in the front end of high speed flash and folding analog-to-digital (A/D) converters. Such A/D converters are widely used in modern communications and data storage integrated circuits. In such applications, the sample and hold (S/H) (either sample and hold or track and hold) circuit must drive a large array of comparators. This presents a large load capacitance and requires a high speed buffer amplifier at the output of the S/H circuit.

The circuit schematic diagram of a conventional prior art buffer amplifier suitable for high speed applications is shown in FIG. 1. Two such buffers are typically used in a differential S/H circuit as shown in FIG. 2, one buffer for the positive terminal (Vinp) of the input and one for the negative terminal (Vinn) of the input. The buffer amplifier as shown in FIG. 1 includes a simple differential amplifier M1 and M2 followed by source follower (transistor M7). The input Vb provides bias current for the entire amplifier. The simplicity of the circuit results in a high speed of operation. However, at low supply voltages, this circuit suffers from two problems: 1) there is insufficient headroom (voltage lower than the supply voltage) for the operation of the source follower transistor M7 and 2) it to ensure that the tail current source, the current through transistor M4, is sufficiently deep into saturation at the full swing of the input signal. This results in a modulation of the tail current, causing harmonic distortion.

It is therefore readily apparent that there is a need for a buffer amplifier circuit usable for high speed S/H applications that addresses and minimizes the above described problems inherent in the prior art circuits.

SUMMARY OF THE INVENTION

In accordance with the present invention, there is provided a new low voltage buffer amplifier usable for data communications, data storage and other high speed applications which provides the above noted desired results.

Briefly, the above is accomplished by adding to the prior art amplifier as illustrated in FIG. 1 an additional transistor (M9) controlled by the input voltage, Vin, in series with the second stage (M5, M6) and a capacitor level shifter (C1) between the output of the first stage (junction of M2 and M3) of the amplifier and the gate termninal of the source follower transistor M7. This capacitor C1 is charged such that the signal between the first stage and the source follower stage sees an upward dc voltage shift, thus maintaining the quiescent gate voltage for the source follower transistor M7 close to or even higher than the supply voltage while maintaining the quiescent voltage at the output of the first stage (junction of M1 and M2) sufficiently low for transistors M2 and M3 to operate in saturation regions.

BRIEF DESCRIPTION OF THE DRAWINGS

Embodiments of the invention have been chosen for purposes of illustration and description and are shown with reference to the accompanying drawings, wherein.

Throughout the drawings, like or similar elements are referred to by like numerals.

DESCRIPTION OF THE PREFERRED EMBODIMENTS

Figure 1:
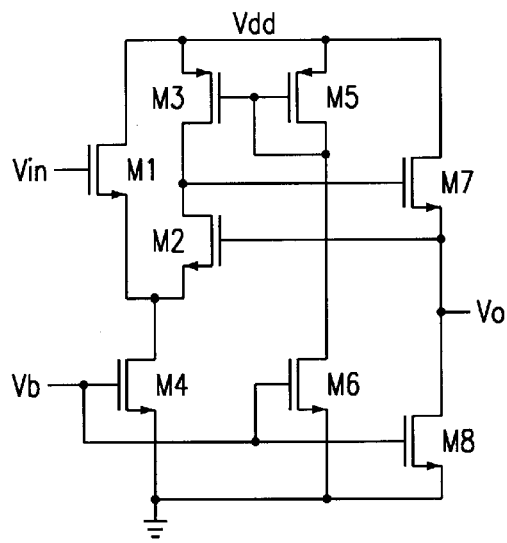
FIG. 1 is a schematic diagram of a conventional prior art buffer amplifier suitable for high speed applications.
Figure 2:
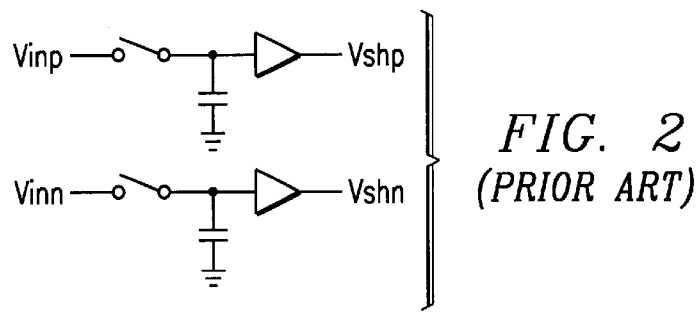
FIG. 2 is a simplified schematic diagram of a differential sample and hold (S/H) circuit in accordance with the prior art.
Figure 3:
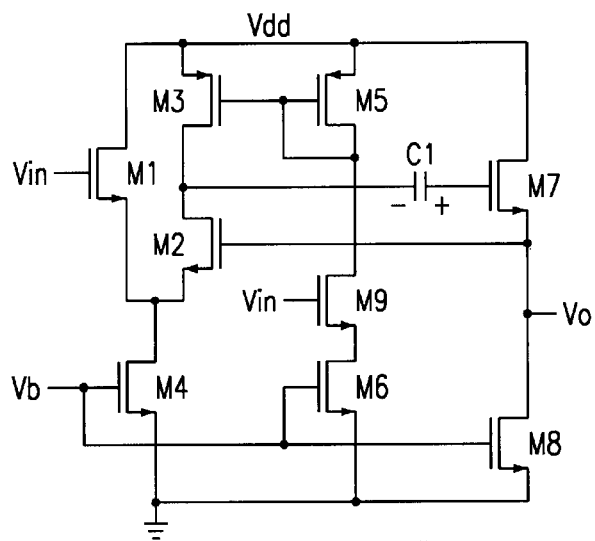
FIG. 3 is a schematic diagram of a buffer amplifier in accordance with the principles of the present invention.

Referring to FIG. 3, there is shown a buffer amplifier circuit implementation that illustrates the principles of the invention. The circuit of FIG. 2 has been altered by the addition of transistor M9 with its drain electrode coupled to the drain electrode of transistor M5 and with its source electrode coupled to the drain electrode of transistor M6. The input to transistor M9 is the same Vin as the input to transistor M1. In addition, capacitor C1 is disposed in series with the path from the junction of the first stage drain electrodes of transistors M2 and M3 to the gate of source follower transistor M7. The bias voltage for the pull-up transistor M3 is derived from the branch consisting of transistors M9, M6 and M5 which replicate the input transistor pair M1 and M2 and its tail current transistor M4. Transistors M1 and M2 produce a differential current which passes through transistor M3 which is a load (acts like a resistor). Thus, any modulation of the input tail current due to the input signal is also reflected in the drain current of transistor M3. This cancels any distortion due to the modulation of the tail current. The fact that the input is sampled and held makes this cancellation robust against the additional delay from the input to the drain current of transistor M3.

Another feature of the amplifier illustrated in FIG. 3 is the capacitive level shifter C1 connected between the amplified output of the first stage (junction of transistors M2 and M3) and the gate terminal of the source follower (transistor M7). This capacitor C1 is charged such that the signal from the first stage to the source follower sees an upward dc voltage shift from the first stage to the source follower stage. The output Vo is the output of the junction of transistors M2 and M3 with the level shift buffer transistor. Thus, the quiescent gate voltage for the source follower M7 can be close to (or even higher than) the supply voltage while maintaining the quiescent voltage at the output of the first stage (the junction of the drain electrodes of transistors M2 and M3) low enough for transistors M2 and M3 to operate in the saturation region. This improves the headroom for the source follower transistor M7.

Figure 4:
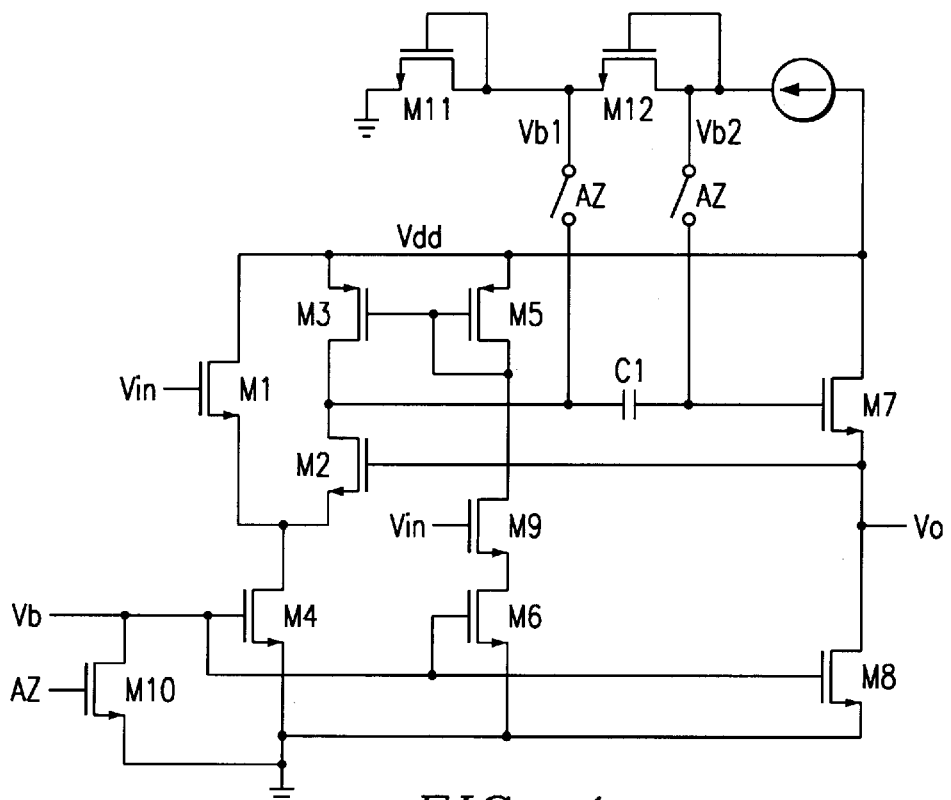
FIG. 4 is an implementation in accordance with the present invention for refreshing a capacitive level shifter.

The charging of the capacitor C1 to an appropriate value can be accomplished in two ways. A first way is to initially charge the capacitor C1 to the correct voltage by directly applying the appropriate voltages thereto as shown in FIG. 4. During the time the signal AZ is high, the voltages Vb1 and Vb2 are applied across capacitor C1. These voltages may be derived using diode connected transistors M11 and M12 in conjunction with switches AZ responsive to and closed by the signal AZ as shown in FIG. 4. With this approach, the voltage across capacitor C1 is equal to a Vgs drop of transistor M12. The first stage (transistors M2 and M3) of the amplifier is forced into a high-impedance state when input signal AZ is high, so that the source of the voltage Vb1 does not have to sink or source any current. This avoids the use of any switches in series with capacitor C1 that would affect performance at high speeds of operation. Once charged, capacitor C1 simply acts as a battery over the next several clock cycles before it is refreshed again by the occurrence of another pulse on input AZ which again temporarily closes switches AZ to recharge capacitor C1. The frequency at which this refreshing has to be performed is a function of leakage currents. In hard disk drive read channel applications, this updating can be performed either at the beginning or the end of a servo wedge when the A/D converter is not required to process any data.

Figure 5:
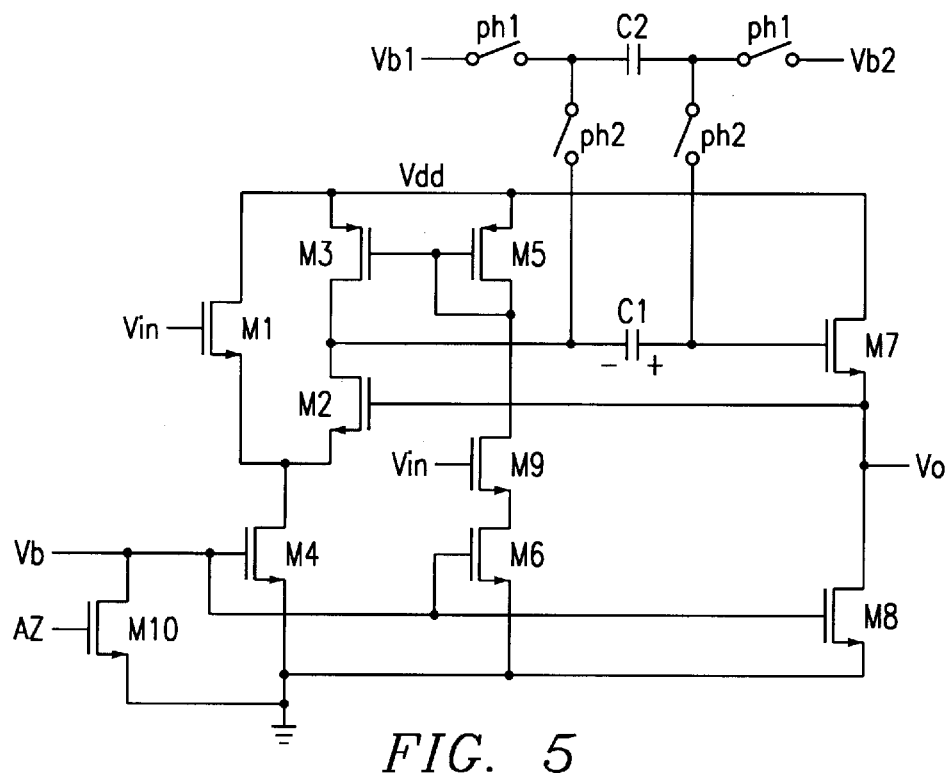
FIG. 5 is a further embodiment in accordance with the present invention for refreshing a capacitive level shifter.

A second procedure for refreshing the voltage across capacitor C1 is shown in FIG. 5. This arrangement is suitable for applications where the A/D converter has to be available continually. Here, capacitor C1 is continually trickle-charged to the correct voltage by means of a switched capacitor C2. During the phase phi of every clock cycle, switches ph1 are closed and switches ph2 are open, allowing capacitor C2 to be charged to the appropriate bias voltage, Vb2–Vb1, whereas, during phase ph2, switches ph2 are closed and switches ph1 are opened, allowing capacitor C1 to be connected in parallel with capacitor C1. This maintains capacitor C1 charged to the appropriate voltage at all times. Because capacitor C2 is only required to make up for any leakage from capacitor C1, the value of capacitor C2 as well as the sizes of the switches ph1, ph2 associated therewith can be very small. This minimizes the effect of charge feedthrough from the updating process. Further, cancellation of the effect of feedthrough is also provided by the pseudo-differential architecture of the S/H circuit.

The amplifier of the present invention is usable in S/H circuits such as described, for example, in copending Provisional U.S. application Ser. No. 60/087,182, entitled "Polarity Shifting Flash A/D Converter and Method", filed on even date herewith, the contents of which are incorporated herein by reference.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modification.

What is claimed is:

1. A buffer amplifier which comprises:
   (a) a coupled differential pair having an input to one of said differential pair and a biasing circuit coupled to the coupling location of said differential pair;
   (b) a load coupled to the other of said differential pair;
   (c) an output circuit having a control electrode; and
   (d) a level shifter coupling said control electrode of said output circuit to said load and the other of said differential pair;
   (e) wherein said level shifter is a capacitor.

2. The amplifier of claim 1 wherein said output circuit includes a source follower, and an output terminal, said source follower coupled between said level shifter and said output terminal.

3. A buffer amplifier which comprises:
   (a) a coupled differential pair having an input to one of said differential pair and a biasing circuit coupled to the coupling location of said differential pair;
   (b) a load coupled between the other of said differential pair and a voltage source, said voltage source also coupled to said one of said differential pair;
   (c) an output circuit coupled to said voltage source having a control electrode; and
   (d) a level shifter coupling said control electrode of said output circuit commonly to said load and the other of said differential pair;
   said load including a first pull up transistor coupled between said other of said differential pair and said voltage source, and a circuit replicating said coupled differential pair and said first pull up transistor including a transistor pair and a second pull up transistor, the control electrodes of said first and second pull up transistors being coupled to each other, the control electrode of one said transistor pair being coupled to said input.

4. The amplifier of claim 3 wherein said output circuit includes a source follower, and an output terminal, said source follower coupled between said level shifter and said output terminal.

5. The amplifier of claim 3 wherein said level shifter is a capacitor.

6. The amplifier of claim 4 wherein said level shifter is a capacitor.

7. The amplifier of claim 3 further including a biasing circuit coupled to the coupling of said differential pair.

8. The amplifier of claim 4 further including a biasing circuit coupled to the coupling of said differential pair.

9. The amplifier of claim 5 further including a biasing circuit coupled to the coupling of said differential pair.

10. The amplifier of claim 6 further including a biasing circuit coupled to the coupling of said differential pair.

* * * * *